US006839219B2

United States Patent
Mashiko et al.

(10) Patent No.: US 6,839,219 B2
(45) Date of Patent: Jan. 4, 2005

(54) LAMINATE FOR FORMING CAPACITOR LAYER AND METHOD FOR MANUFACTURING THE SAME

(75) Inventors: Yasuaki Mashiko, Ageo (JP); Hideshi Sekimori, Ageo (JP); Naotomi Takahashi, Ageo (JP)

(73) Assignee: Mitsui Mining & Smelting Co., Ltd., Tokyo (JP)

(*) Notice: Subject to any disclaimer, the term of this patent is extended or adjusted under 35 U.S.C. 154(b) by 0 days.

(21) Appl. No.: 10/466,886

(22) PCT Filed: Sep. 25, 2002

(86) PCT No.: PCT/JP02/09860
§ 371 (c)(1),
(2), (4) Date: Jul. 22, 2003

(87) PCT Pub. No.: WO03/028419
PCT Pub. Date: Apr. 3, 2003

(65) Prior Publication Data
US 2004/0053020 A1 Mar. 18, 2004

(30) Foreign Application Priority Data

Sep. 26, 2001 (JP) .......................... 2001-293589
May 30, 2002 (JP) .......................... 2002-157068

(51) Int. Cl.$^7$ .............................. H01G 4/06; H01G 4/10
(52) U.S. Cl. ........................................ 361/311; 361/322
(58) Field of Search .................. 361/306.3, 311–313, 361/320, 321.1, 322, 25.42; 29/25.42

(56) References Cited

U.S. PATENT DOCUMENTS 6,433,993 B1 * 8/2002 Hunt et al. ............. 361/303

FOREIGN PATENT DOCUMENTS

| EP | 1100295 A2 | 5/2001 |
| JP | 51-40563 A | 4/1976 |
| JP | 55-8054 A | 1/1980 |
| JP | 59-171112 A | 9/1984 |
| JP | 8-269799 A | 10/1996 |

* cited by examiner

Primary Examiner—Eric Thomas
(74) Attorney, Agent, or Firm—Rothwell, Figg, Ernst & Manbeck, P.C.

(57) ABSTRACT

An object of the present invention is to provide a laminate for forming a capacitor layer for a printed wiring board which is capable of ensuring a higher capacitance and an inner layer core material using the laminate for example. In order to achieve this object, a material for forming a capacitor layer comprising a three-layered structure of an aluminum layer 2/a modified alumina barrier layer 3/an electrode copper layer 4 is used, such as a laminate 1a for forming a capacitor layer in which the above described modified alumina barrier layer 3 is obtained through subjecting one side of an aluminum plate or aluminum foil to an anodic treatment to form an alumina barrier layer as a uniform oxide layer and then subjecting the alumina material with the above described alumina barrier layer formed thereon to a boiling and modifying treatment in water and the above described modified aluminum barrier layer 3 is used as a dielectric layer.

9 Claims, 9 Drawing Sheets (a)

(b)

(c)

(i)

(j)

(k)

(l)

LAMINATE FOR FORMING CAPACITOR LAYER AND METHOD FOR MANUFACTURING THE SAME

TECHNICAL FIELD OF THE INVENTION

The present invention relates to a laminate for forming a capacitor layer used for manufacturing a multi-layer printed wiring board or the like and a method for manufacturing the same.

BACKGROUND ART

Recently, an operation speed of a computer has been dramatically improving in a fast-evolving manner, and even in the case of a personal computer intended for home use, the clock frequency thereof has reached a GHz level, thus, it is inevitable that a signal transmission speed is becoming increasingly faster. And, as an information network is gradually formed all over the society along with generalization of office automation and a LAN system, a server as peripheral equipment of the computer has become widely used because of the necessity for information management of a plurality of computers.

This server generally includes bulk memory capable of centralized management of a huge amount of information and is required to have high-speed operation performance allowing for simultaneously accessing from the plurality of computers. Therefore, the signal transmission within the server is required to be carried out faster and malfunctions during the transmission have to be minimized.

In order to achieve a use environment as described above, circuit design of a central processing unit (CPU) and performance of an IC chip for example are important, and further, circuit design of a printed wiring board on which the CPU and the IC chip are mounted also become very important. Manufacturers of the printed wiring boards have devised various means in order to achieve the enhancement of the signal transmission speed described above, and for example, a structure of the printed wiring board has been made into a multi layered structure, and as for the circuit arrangement, the circuit design is changed to decrease a signal transmission distance.

In particular, a capacitor which plays a role for stably supplying operation power of a device has generally disposed as an external layer of the printed wiring board, however, a method in which a capacitor is made of a double-sided copper clad laminate as an internal layer of a multi-layer printed wiring board has widely spread because the printed wiring board can be formed thinner and excellent performance can be obtained. And, in order to form this capacitor layer, various thin materials for forming the capacitor layer has been proposed.

For example, as this material for forming the capacitor layer, a so-called double-sided copper clad laminate in which an FR-4 insulating base material being formed of a glass cloth impregnated with epoxy resin is used as a dielectric layer and copper foil is laminated to both sides of the base material, or a double-sided copper clad laminate comprising a dielectric layer without a skeletal material such as the glass cloth has been used.

However, in the case of using the material for forming the capacitor layer which has been conventionally supposed, it has been very difficult to make the dielectric layer thinner during the formation thereof, and consequently, it has also become difficult to increase a capacitance of the capacitor thus formed.

That is, the material for forming the embedded capacitor layer which comprises the double-sided copper clad laminate including the FR-4 base material has the glass cloth as the skeletal material within the insulating layer, so that there is a certain limit to the thickness control when the layer is made thinner. In addition, when the copper clad laminate is formed by laminating the copper foil and the FR-4 base material and then subjecting the laminate to hot press molding, a waviness shape of the glass cloth may develop on a surface of the laminate, so that it is difficult to make the layer flat completely. Even if a prepreg which uses a glass cloth as a skeletal material is used for forming an insulating layer, a limiting thickness of the prepreg is about 50 μm and it has been impossible to make the prepreg thinner than 50 μm.

Further, there has been a demand for a material which provides a capacitor having higher capacitance, therefore, an attempt to manufacture a thin double-sided copper clad laminate for forming a capacitor layer has been made by using two sheets of resin-applied copper foil each of which is copper foil having a resin layer on one side thereof and then laminating these copper foil such that respective resin layers directly contact with each other. In this method, it is easily possible to make the resin layer thinner because a skeletal material is not included within the resin layer to be used as a dielectric layer, and consequently, it is also possible to obtain an insulating layer to be used as a dielectric layer having a thickness of 20 μm or less that is substantially thinner compared to a case of the above described FR-4 base material, so that the capacitance of the capacitor can be increased to a high level such as 1 nF/cm$^2$ to 2 nF/cm$^2$. However, even in this method, the thickness control of the resin layer of the resin-applied copper foil has been carried out on the order of microns, so that it has been impossible to make the dielectric layer further thinner.

BRIEF DESCRIPTION OF THE DRAWINGS

In addition.

Each of FIG. 5, FIG. 6

In addition, each of FIG. 8, FIG. 9

SUMMARY OF THE INVENTION

As a result of making an intensive study, the inventors of the present invention has conceived of providing a capacitor layer constructing material by using an oxide film without electrical conductivity as a dielectric layer of a capacitor. Now, the present invention will be described.

Figure 1:
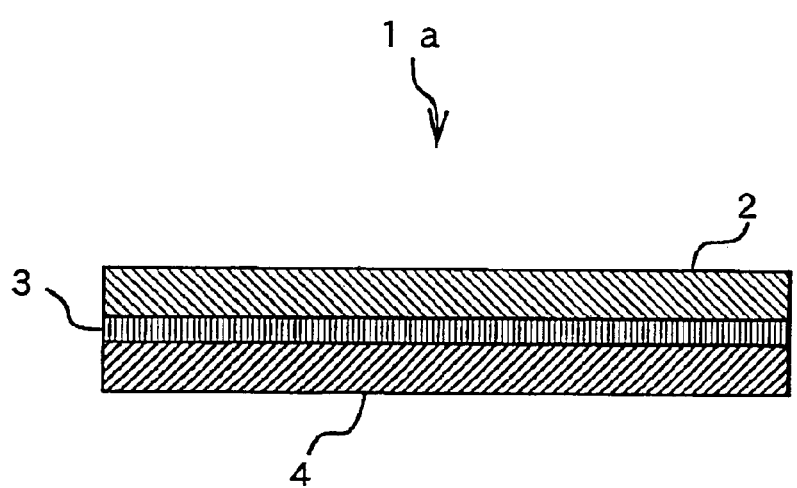
FIG. 1 is a schematic sectional view of a laminate for forming a capacitor layer according to the present invention.

A first laminate for forming a capacitor layer is defined as "a laminate for forming a capacitor layer comprising a three-layered structure of an aluminum layer/a modified alumina barrier layer/an electrode copper layer, characterized in that the above described modified alumina barrier layer is obtained through subjecting one side of an aluminum plate or aluminum foil (referred to as "an aluminum material" hereinafter) to an anodic treatment to form an alumina barrier layer which is a uniform oxide layer and then subjecting the aluminum material on which the above described alumina barrier layer is formed to a boiling treatment in water, and the above described modified alumina barrier layer being used as a dielectric layer." The schematic sectional view of this first laminate 1a for forming the capacitor layer is shown in FIG. 1. It should be clearly mentioned here that sectional views used in the present specification are strictly for the purpose of illustrating schematic views such that the layer constructions at respective points are clearly understood, so that the thickness of each layer does not correspond to that of an actual product.

In addition, a method for manufacturing the laminate is defined as "a method for manufacturing the laminate for forming the capacitor layer which has the three-layered structure of the aluminum layer/the modified alumina barrier layer/the electrode copper layer and uses the modified alumina barrier layer as the dielectric layer, characterized in that the method comprises (1) a barrier-layer-forming step in which an aluminum material undergoes anodic polarization within an electrolyte and then an alumina barrier layer which is a uniform oxide layer having a thickness of 1 $\mu$m or less is formed on a surface of the aluminum material (thus obtained material will be referred to as "an alumina barrier layer-applied aluminum material" hereinafter), (2) a boiling-and-modifying step for boiling the above described alumina barrier layer-applied aluminum material in water and subjecting the alumina barrier layer to a modifying treatment to obtain the modified alumina barrier layer, and (3) an electrode-copper-layer-forming step for forming a thin film copper layer having a thickness of 2 $\mu$m or less on a surface of the modified alumina barrier layer by means of an electroless plating method or a vapor phase deposition method and then further precipitating copper on a surface of thus formed thin film copper layer by means of an electrolytic copper plating method."

In this specification, a laminate 1a for forming the capacitor layer is partially specified by a manufacturing method. Therefore, the manufacturing method defined in claims will be described predominantly and the laminate for forming the capacitor layer obtained by such manufacturing method will also be described.

In the laminate 1a for forming the capacitor layer used for the present invention, a material referred to as an aluminum plate or aluminum foil is used as a starting material for obtaining the laminate for forming the capacitor layer. In this case, a reason for using "an aluminum plate or aluminum foil" is as follows. That is, generally, a substance referred to as foil is a metal material having a thickness of 200 $\mu$m or less and a substance which is thicker than 200 $\mu$m is classified into a plate group, but these substances can not be definitely classified in a scientific manner, so that the above described terms are adopted. In the present specification, such material is referred to as merely "an aluminum material" for simplicity of the description and for facilitating the understanding of the description.

A concept of a material forming an aluminum material 2 includes for example a so-called pure aluminum having a purity of 99.99% and also includes an aluminum material containing alloy elements such as manganese and chromium. However, the alloy elements within the aluminum material are not completely in a state of a solid solution and tend to segregate as dispersible particles, and especially, manganese, chromium and copper have properties capable of changing a color tone of an anodic film when the oxide film is formed by an anodic treatment as described below, so that such elements are preferentially dissolved in the electrolyte if a larger amount of elements are contained, and consequently, it can be considered that it is difficult to form a uniform oxide film of aluminum. Therefore, it is desirable to use an aluminum material whose purity is higher as much as possible.

Figure 5:
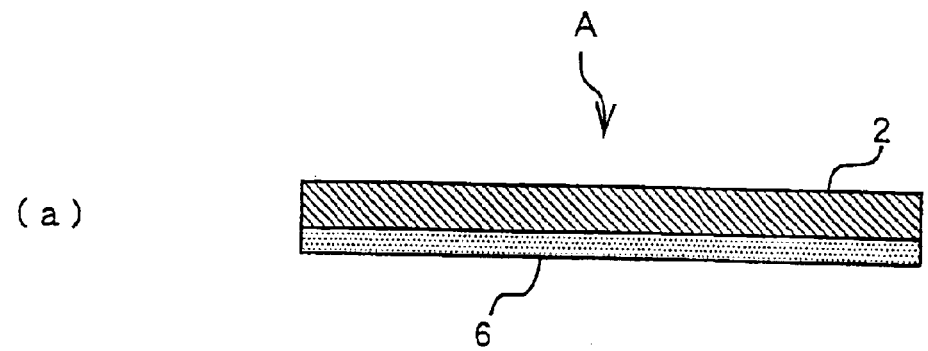
Figure 5:
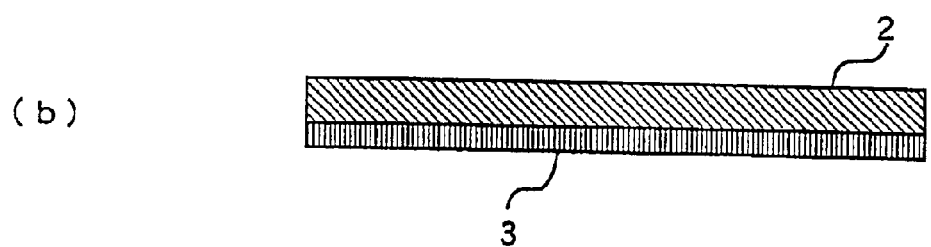
Figure 5:
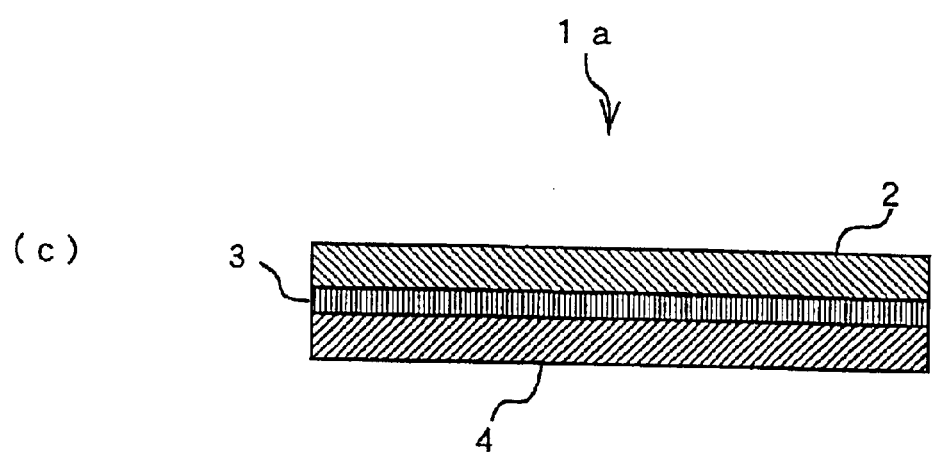

Firstly, in a step of forming an alumina barrier layer shown in FIG. 5($a$), this aluminum material 2 is subjected to an anodic treatment. The term of anodic treatment means a film forming reaction in which an oxide layer, a hydroxide layer, etc. are formed on a surface of a metal material after this metal material undergoes anodic polarization within a solution. In this specification, this term is used for representing a treatment in which the aluminum material 2 is used as an anodic electrode and undergoes the anodic polarization for forming an oxide (alumina) film. As an electrolyte which is used in this treatment, it is desirable to use a solution which can be used for widely-known anodizing as an anodic treatment of aluminum and easily provides a non-porous oxide film.

Specifically, such electrolytes include a boric acid solution, a ammonium borate solution, an ammonium adipate solution, an ammonium phosphate solution, an ammonium tartrate solution, and the like. The electrolyte concentration and the solution temperature for example are arbitrarily controlled depending on a thickness of the non-porous oxide film to be formed, a formation voltage or the like, so that there is no need to particularly limit these conditions.

Figure 2:
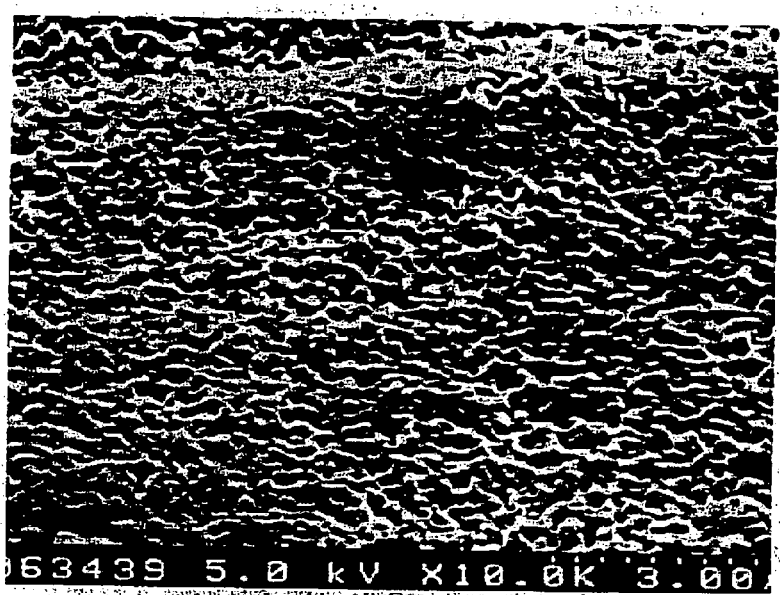
FIG. 2 shows a scanning electron microscope image of a surface obtained through subjecting an aluminum material to an anodic treatment for forming a non-porous oxide film.

The anodic treatment of aluminum can be carried out with widely changing electrolyte concentrations, times, temperatures, and current densities, therefore, a thickness and properties of the oxide film formed on a surface of the aluminum material will vary by the change of the above described factors. There is no need to particularly limit the setting conditions, and these conditions can be arbitrarily selected in accordance with the steps. However, in the present invention, unlike an operation referred to as anodizing being typical of anodic treatments of aluminum in which a porous film is formed on a non-porous oxide film, the growth of the oxide film has to be stopped in a certain state where a surface of a non-porous oxide film becomes smooth as seen in a scanning electrode microscopic observation image shown in FIG. 2. In this specification, the non-porous oxide film is referred to as an alumina barrier layer. The alumina barrier layer which is the above described non-porous oxide film can be manufactured such that a thickness of the alumina barrier layer generally becomes 3 $\mu$m or less.

However, considering that the non-porous aluminum oxide (alumina) layer thus manufactured is used as a dielectric layer which is used as a capacitor, it is required that a thickness of the layer should be formed uniformly. Now, as for a forming process of an alumina barrier layer 6, an aluminum material is placed in an electrolyte to undergo anodic polarization, then oxygen is generated from a surface of the aluminum material 2, and consequently, the surface of the aluminum material 2 is immediately converted to alumina components which are aluminum oxides. Subsequently, the oxygen generated in the proximity of the surface of the aluminum material 2 diffuses into the alumina layer while allowing the alumina barrier layer 6 to grow.

This alumina barrier layer seems to grow at a rate ranging from 1.3 nm to 1.4 nm per formation voltage applied thereto. However, the alumina layer itself is electrically passivated. Therefore, as the alumina barrier layer 6 grows to be a thicker layer, electricity becomes hard to be conducted through this layer and also a generating amount of oxygen decreases, thus, the alumina barrier layer 6 has its growth limit.

Consequently, in terms of the capacitance stability when the above described layer is ultimately used as a capacitor, it can be decided that a uniform alumina barrier layer 6 is believed to be formed when a thickness of this alumina barrier layer 6 is 1 μm or less. That is, if an alumina barrier layer 6 having a thickness above 1 μm is formed, the growth of the alumina barrier layer 6 is dominated by diffusion-controlling of oxygen within the alumina barrier layer 6, and there is a high possibility that the growth is concentrated at certain portions such as micro cracks believed to be present in the alumina barrier layer 6 into which oxygen easily diffuses, so that it can be considered that the thickness of the alumina barrier layer 6 tends to become non-uniform as a whole. This result is corroborated by the following experiments. That is, a laminate for forming a capacitor layer is manufactured by the use of a 30 cm square of aluminum foil having a thickness of 100 μm, and subsequently the capacitance is measured at each of a plurality of points within the region. Then, it is found that variations in capacitance values at respective measured sites of an alumina barrier layer 6 having a thickness of 1 μm or less are different from that of an alumina barrier layer 6 having a thickness of about 2 μm, and consequently, the variations in the case of the alumina barrier layer 6 having a thickness of about 2 μm becomes larger.

In the alumina barrier-layer-forming step as described above, an aluminum plate or aluminum foil (referred to as "an aluminum material" hereinafter) undergoes anodic polarization within an electrolyte, and then an alumina barrier layer 6 which is a uniform oxide layer having a thickness of 1 μm or less is formed on a surface of an aluminum material 2. In this specification, a product thus obtained is referred to as "an alumina barrier layer-applied aluminum material" for convenience of explanation. Although a thickness of the alumina barrier layer 6 is described as 1 μm or less, the most preferable thickness is within a range between 40 nm and 980 nm which can be obtained with the formation voltage of 30V to 700V applied thereto, under the condition that a growth rate is 1.4 nm per formation voltage (hereinafter, an explanation will be made by using values expressed in the unit nm). If the thickness is less than 40 nm, the growth of the alumina barrier layer is half-finished, and a capacitance of the capacitor which can be finally obtained easily varies. On the other hand, if the thickness is intended to be made above 980 nm, a porous oxide film is produced at this point.

Figure 3:
FIG. 3 shows a scanning electron microscope image of a modified alumina barrier layer after boiling and modifying an aluminum material which has an alumina barrier layer.

Next, this alumina barrier layer-applied aluminum material A is placed into boiling water and subjected to a boiling treatment. In this boiling treatment, the alumina barrier layer-applied aluminum material A is placed into boiling water and the alumina barrier layer 6 is allowed to be modified by the boiling. The alumina barrier layer 6 modified by this boiling treatment is referred to as "a modified alumina barrier layer 3," and FIG. 3 shows a scanning electron microscope image obtained by observing the modified alumina barrier layer 3. Although it becomes apparent from comparing the FIG. 3 with a scanning electron microscopic image shown in FIG. 2, the smooth alumina barrier layer 6 has been converted to a modified alumina barrier layer 3 which is just like a porous layer.

Indeed, sealing for obtaining a higher corrosion resistance which is performed after forming a porous oxide film on a non-porous oxide film may also use boiling water, but the boiling water is used for only sealing the pores on the porous oxide film. Therefore, a meaning of using the boiling water in such sealing is fundamentally different from a meaning of practically using boiling water in the present invention. Preferably, the boiling treatment in the present invention is carried out within a range between one second and one hour. In the case of boiling less than one second, modification of the alumina barrier layer 6 is inadequate, so that the favorable morphological modification as shown in FIG. 3 can not be made. If the boiling continues in excess of one hour, there is a danger that the aluminum material itself begins to undergo erosion by water, so that the product quality will be impaired.

In addition, modification of the alumina barrier layer into the modified alumina barrier layer 3 which is just like a porous layer allows for improvement of adhesion strength at an interface between an electrode copper layer 4 as described below and the modified alumina barrier layer 3. This is because the electroless copper plating or the like penetrates into the porous modified alumina barrier layer 3 and an anchor effect is produced. A step in which the above described boiling treatment is conducted is a boiling-and-modifying step.

After the formation of the modified alumina barrier layer 3 is completed in the boiling-and-modifying step, an electrode copper layer 4 is formed on the above described modified alumina barrier layer 3 by a step shown in FIG. 5(c). In this specification, the term of electrode copper layer is used because this layer becomes an electrode surface when a capacitor circuit is formed. Even if a copper layer is intended to be formed on the modified alumina barrier layer 3, the copper layer can not be formed by directly using an electrolytic method because the modified alumina barrier layer 3 itself is passivated and a current can not pass through the layer.

Thus, a thin film copper layer is firstly formed on a surface of the modified alumina barrier layer 3 by means of a wet electroless copper plating or dry vapor phase deposition method. Each of these techniques is extremely excellent as a method for forming an extremely uniform thin film. The copper layer which is firstly formed is referred to as a thin film copper layer. Indeed, there is no problem in forming the whole electrode copper layer 4 only by means of the electroless copper plating or the vapor phase deposition method. However, considering the production rates and the production costs, it is preferable that only an initial copper layer is formed by the electroless copper plating or vapor phase deposition to manufacture a thin film copper layer having a thickness of 2 μm or less, and then the copper layer is allowed to grow by means of an electrolytic method described below to complete the formation of the electrode copper layer 4.

In this case, a solution which is used for the electroless copper plating is not particularly limited. Generally, considering a catalytic activity for oxidation of a reducing agent, a solution containing formaldehyde is used and also a strong alkalinity solution is used for the electroless copper plating. For example, among the electroless copper plating baths which are used under the condition of a room temperature are (1) a bath comprising copper sulfate, Rochelle salt, formaldehyde, sodium carbonate and sodium hydroxide, (2) a bath comprising copper sulfate, Rochelle salt, formaldehyde and an addition agent as a stabilizer, etc. In addition, it can be consciously specified that a pretreatment such as catalyzation of palladium is ought to be done if required before the electroless copper plating.

In the dry vapor phase deposition, it is intended to use a technique such as heating deposition performed within a vacuum atmosphere in which an alumina barrier layer-applied aluminum material is placed or so-called sputtering deposition in which electron beam irradiation of a copper target is performed. In terms of a thickness of the thin film copper layer, there is a high possibility that a thin film which is more uniform and free of defects compared with a film obtained by the electroless copper plating can be formed.

Then, a copper layer is allowed to grow further on the thin film copper layer being formed on the modified alumina barrier layer 3 by means of an electrolytic method. In the case of a laminate for forming a capacitor layer described in claims, this copper layer which has been subsequently grown is referred to as "an electrode copper layer." As an electrolyte which is used for the electrolytic method, a solution capable of supplying copper ions such as a copper sulfate-based solution or a copper pyrophosphate-based solution is used for example, and it is not necessary to particularly limit the selection of such solutions. For example, bright plating conditions as follows are adopted: if the copper sulfate-based solution is used, this solution is prepared such that a concentration of copper is 30 to 100 g/l, a concentration of sulfuric acid is 50 to 200 g/l, a solution temperature is 30 to 80° C., and a current density is 1 to 100 A/dm$^2$; and if the copper pyrophosphate-based solution is used, this solution is prepared such that a concentration of copper is 10 to 50 g/l, a concentration of potassium pyrophosphate is 100 to 700 g/l, a solution temperature is 30 to 60° C., pH 8 to 12, and a current density is 1 to 10 A/dm$^2$.

In this manner, the laminate 1a for forming the capacitor layer can be obtained, which is characterized by comprising the three-layered structure of the aluminum layer 2/the modified alumina barrier layer 3/the electrode copper layer 4, the modified alumina barrier layer 3 being used as the dielectric layer. Capacitance of the capacitor manufactured by using thus obtained laminate for forming the capacitor layer is 5 nF/cm$^2$ to 100 nF/cm$^2$ on average, which is a high capacitance being considered unthinkable in the past.

Figure 4:
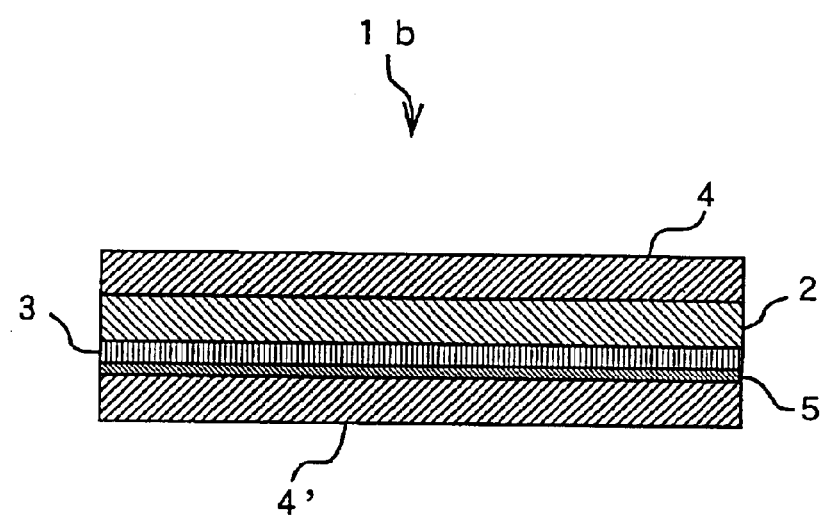
FIG. 4 is a schematic sectional view of a laminate for forming another capacitor layer according to the present invention.

Next, a second laminate for forming a capacitor layer is defined as "a laminate for forming a capacitor layer comprising a five-layered structure of a second electrode copper layer/a binder metal layer/a modified alumina barrier layer/an aluminum layer/a first electrode copper layer, characterized in that the binder metal layer is made of any of aluminum, nickel, or chromium, or an alloy thereof, and that the above described modified alumina barrier layer is obtained through subjecting one side of an aluminum material to an anodic treatment to form an alumina barrier layer which is a uniform oxide layer and then subjecting the aluminum material on which the above described alumina barrier layer is formed to a boiling treatment in water, the above described modified alumina barrier layer being used as a dielectric layer." The laminate for forming the capacitor layer already mentioned above has a copper layer on only one side thereof, while the second laminate for forming the capacitor layer has copper layers on both sides thereof. Providing the copper layers for both sides in this manner, electrodes on both sides of a capacitor circuit to be formed can be made of copper, and it becomes easy to adopt a plating method as means for providing interlayer conduction when a multi-layer printed wiring board is fabricated. FIG. 4 is a schematic sectional view of this second laminate 1b for forming the capacitor layer. In this specification, these copper layers on both sides are distinguished from each other by using the terms such as a first electrode copper layer 4 and a second electrode copper layer 4', but it is not necessary to distinguish one copper layer from another. That is, these terms are used only for convenience of explaining the manufacturing method.

A method for manufacturing the second laminate 1b for forming the capacitor layer is defined as "a method for manufacturing the laminate for forming the capacitor layer characterized by comprising the five-layered structure of the second electrode copper layer/the binder metal layer/the modified alumina barrier layer/the aluminum layer/the first electrode copper layer and by using the modified alumina layer as the dielectric layer, characterized in that the method comprises (1) a first-electrode-copper-layer-forming step in which a thin film copper layer having a thickness of 2 µm or less is formed on one side of an aluminum material by means of an electroless plating method or a vapor phase deposition method and then copper is further precipitated on a surface of thus formed thin film copper layer by means of an electrolytic copper plating method to form the first electrode copper layer, (2) a barrier-layer-forming step in which an aluminum plate on which the above described first electrode copper layer is formed undergoes anodic polarization within an electrolyte and an alumina barrier layer which is a uniform oxide layer having a thickness of 1 µm or less is formed on the other side of the aluminum plate on which the first electrode copper layer is not formed (thus obtained material will be referred to as "a first electrode copper layer and an alumina barrier layer-applied aluminum material" hereinafter), (3) a boiling-and-modifying step for boiling the above described alumina barrier layer-applied aluminum material in water to convert the alumina barrier layer into the modified alumina barrier layer, (4) a binder-metal-layer-forming step for providing the binder metal layer made of any of aluminum, nickel, or chromium on a surface of the modified alumina barrier layer by means of the vapor phase deposition method, and (5) a second-electrode-copper-layer-forming step for forming a copper layer which becomes the second electrode copper layer on a surface of the above described binder metal layer."

According to the manufacture of this laminate for forming the capacitor layer, in the first-electrode-copper-layer-forming step shown in FIG. 6(a), a thin film copper layer having a thickness of 2 µm or less is firstly formed on one side of an aluminum material 2 by means of an electroless plating method or a vapor phase deposition method, and then copper is further precipitated on a surface of the above described thin film copper layer by means of the electrolytic copper plating method to form a first electrode copper layer 4. The thin film copper layer and the electrolytic copper plating in this case are the same as that already mentioned, so that the detailed description will be omitted to avoid repeatedly explaining thereof.

Then, in the barrier-layer-forming step, the aluminum plate 2 on which the above described first electrode copper layer 4 is formed undergoes anodic polarization within the electrolyte, and an alumina barrier layer 6 which is a uniform oxide layer having a thickness of 1 µm or less is formed on the other side of the aluminum plate 2 on which the first electrode copper layer 4 is not formed, as shown in FIG. 6(b). Since the method for forming the alumina barrier layer 6 in this case is also the same as that already mentioned, the detailed description will be omitted to avoid repeatedly explaining thereof.

Subsequently, in the boiling-and-modifying step shown in FIG. 6(c) in order to modify the alumina barrier layer 6, the aluminum material 2 provided with the above described first electrode copper layer 4 and the alumina barrier layer 6 is boiled in water and then the alumina barrier layer 6 is subjected to a modifying treatment to obtain a modified alumina barrier layer 3. Since this modifying treatment is also the same as that already mentioned, the detailed description will be omitted to avoid repeatedly explaining thereof.

Subsequently, in the binder-metal-layer-forming step shown in FIG. 6(*d*), a binder metal layer 5 made of any of aluminum, nickel or chromium, or an alloy thereof is formed on a surface of the modified alumina barrier layer 3 of the aluminum material 2 which has already been subjected to the boiling-and-modifying step and is provided with the above described first copper layer 4 and the modified alumina barrier layer 3, by means of the vapor phase deposition method. It is intended to use the binder metal layer 5 for improving an adhesive property between the modifies alumina barrier layer 3 and a second electrode copper layer 4' by placing the binder metal layer 5 between these two layers 3 and 4'. As the vapor phase deposition in this case, it is also possible to use the same technique as already mentioned in which the thin film copper layer of the above described first electrode copper layer 4, so that the detailed description will be omitted to avoid repeatedly explaining thereof.

Figure 6:
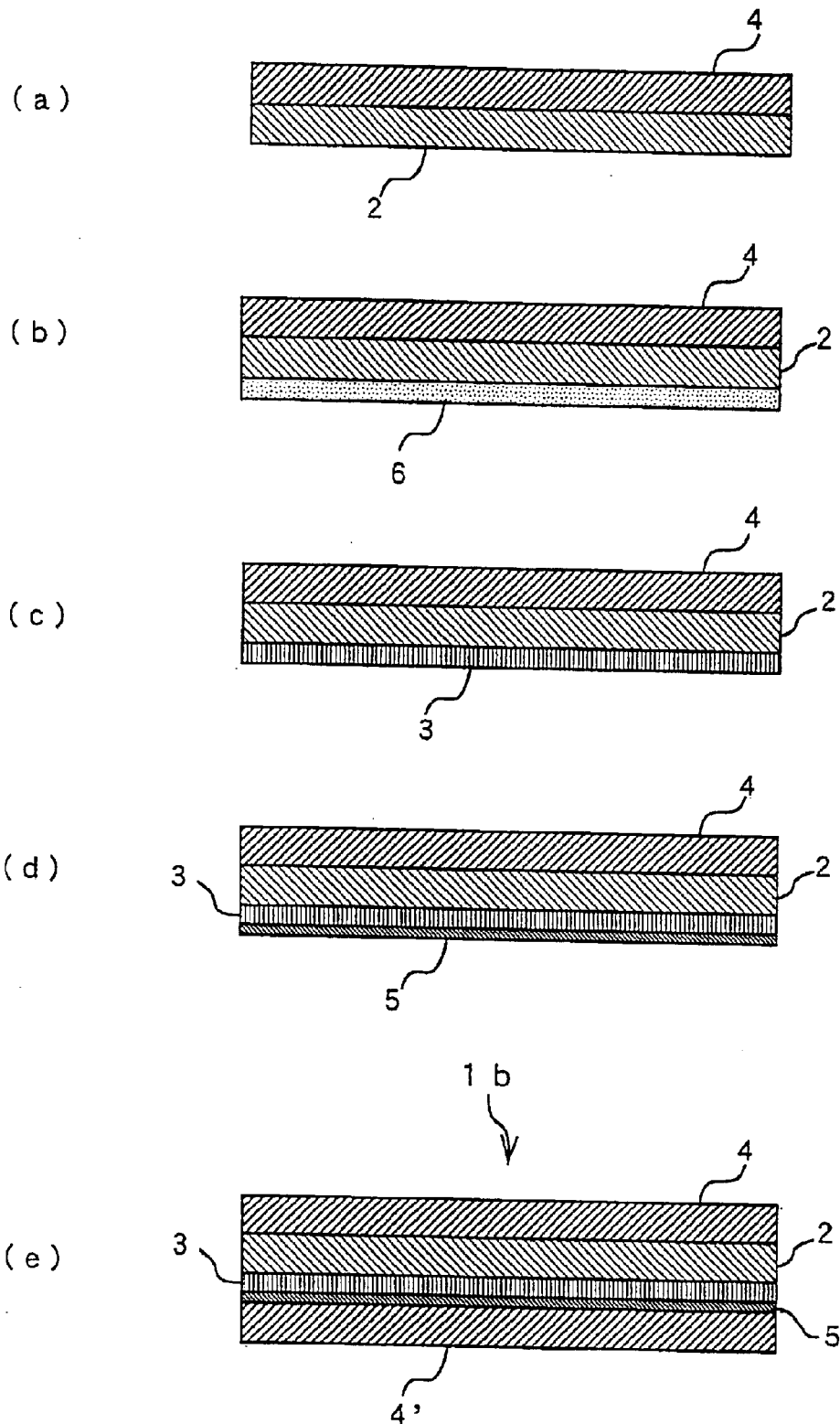

Finally, in the second-electrode-copper-layer-forming step shown in FIG. 6(*e*), a copper layer which becomes the second electrode copper layer 4' is formed on a surface of the above described binder metal layer 5. The most preferable method for forming the second metal copper layer 4' depends on components including aluminum, nickel or chromium, or an alloy thereof which have been used for forming the binder metal layer 5. As for the method for precipitating copper in this case, it is also the same as that already mentioned, so that the detailed description will be omitted to avoid repeatedly explaining thereof.

If the binder metal layer 5 is made of any of nickel or chromium, or an alloy thereof, it becomes possible to directly perform electrodeposition of the second electrode copper layer on a surface of the layer 5 by means of the electrolytic method. Of course, there is no problem even if the electroless copper plating is initially carried out.

On the other hand, if the binder metal layer 5 is made of aluminum or an aluminum-based alloy, the adhesive property may be inadequate after the copper layer is directly formed thereon. Therefore, it is preferable that a trace amount of zinc or chromium is precipitated on a surface of the above described binder metal layer 5 before precipitating copper for forming the second electrode copper layer 4' by means of the electrolytic method. Such concept can be introduced to the whole of the present invention in order to improve the interlayer adhesive property between the copper layer and the aluminum layer, and a layer for ensuring the adhesive property between the copper layer and the aluminum layer can be arbitrarily provided. Such layer is referred to as a seed metal layer.

In addition, it is possible to adopt another manufacturing method as a method for manufacturing the second laminate 1*b* for forming the capacitor layer. The manufacturing method is defined as "a method for manufacturing the laminate for forming the capacitor layer characterized by comprising the five-layered structure of the second electrode copper layer/the binder metal layer/the aluminum layer/the modified alumina barrier layer/the first electrode copper layer and by using the modified alumina layer as the dielectric layer, characterized in that the method comprises (1) a first-electrode-copper-layer-forming step in which a first electrode copper layer is formed on a surface of aluminum foil by cladding the aluminum foil with the copper foil, (2) a barrier-layer-forming step in which an aluminum plate on which the above described first electrode copper layer is formed undergoes anodic polarization within an electrolyte and an alumina barrier layer which is a uniform oxide layer having a thickness of 1 $\mu$m or less is formed on the other side of the aluminum plate on which the first electrode copper layer is not formed (thus obtained material will be referred to as "a first electrode copper layer and an alumina barrier layer-applied aluminum material" hereinafter), (3) a boiling-and-modifying step for boiling the above described alumina barrier layer-applied aluminum material in water to convert the alumina barrier layer into the modified alumina barrier layer, (4) a binder-metal-layer-forming step for providing the binder metal layer made of any of aluminum, nickel, or chromium on a surface of the modified alumina barrier layer by means of a vapor phase deposition method, and (5) a second-electrode-copper-layer-forming step for forming a copper layer which becomes the second electrode copper layer on a surface of the above described binder metal layer."

The already mentioned method for manufacturing the second laminate 1*b* for forming the capacitor layer is different from this manufacturing method only in terms of a manufacturing procedure (1). The former adopts an electrochemical technique for forming the first electrode copper layer, while the latter uses a rolling technique to laminate the aluminum foil and the copper foil together. The subsequent steps are the same.

It is possible to adopt still another manufacturing method as a the third method for manufacturing the laminate for forming the capacitor layer. The manufacturing method is defined as "a method for manufacturing the laminate for forming the capacitor layer characterized by comprising the five-layered structure of the second electrode copper layer/ the binder metal layer/the aluminum layer/the modified alumina barrier layer/the first electrode copper layer and by using the modified alumina layer as the dielectric layer, characterized in that the method comprises (1) an alumina barrier-layer-forming step in which an aluminum material undergoes anodic polarization within an electrolyte and an alumina barrier layer which is a uniform oxide layer having a thickness of 1 $\mu$m or less is formed on one side of the aluminum material, (2) a boiling-and-modifying step for boiling the above described alumina barrier layer-applied aluminum material in water and subjecting the alumina barrier layer to a modifying treatment to obtain a modified alumina barrier layer, (4) a binder-metal-layer-forming step for providing the binder metal layer made of any of aluminum, nickel, or chromium on a surface of the modified alumina barrier layer by means of the vapor phase deposition method, and (5) an electrode-copper-layer-forming step in which the first electrode copper layer is formed on a surface of an outer layer of the aluminum material and a copper layer which becomes the second electrode copper layer is formed on a surface of the above described binder metal layer."

Figure 7:
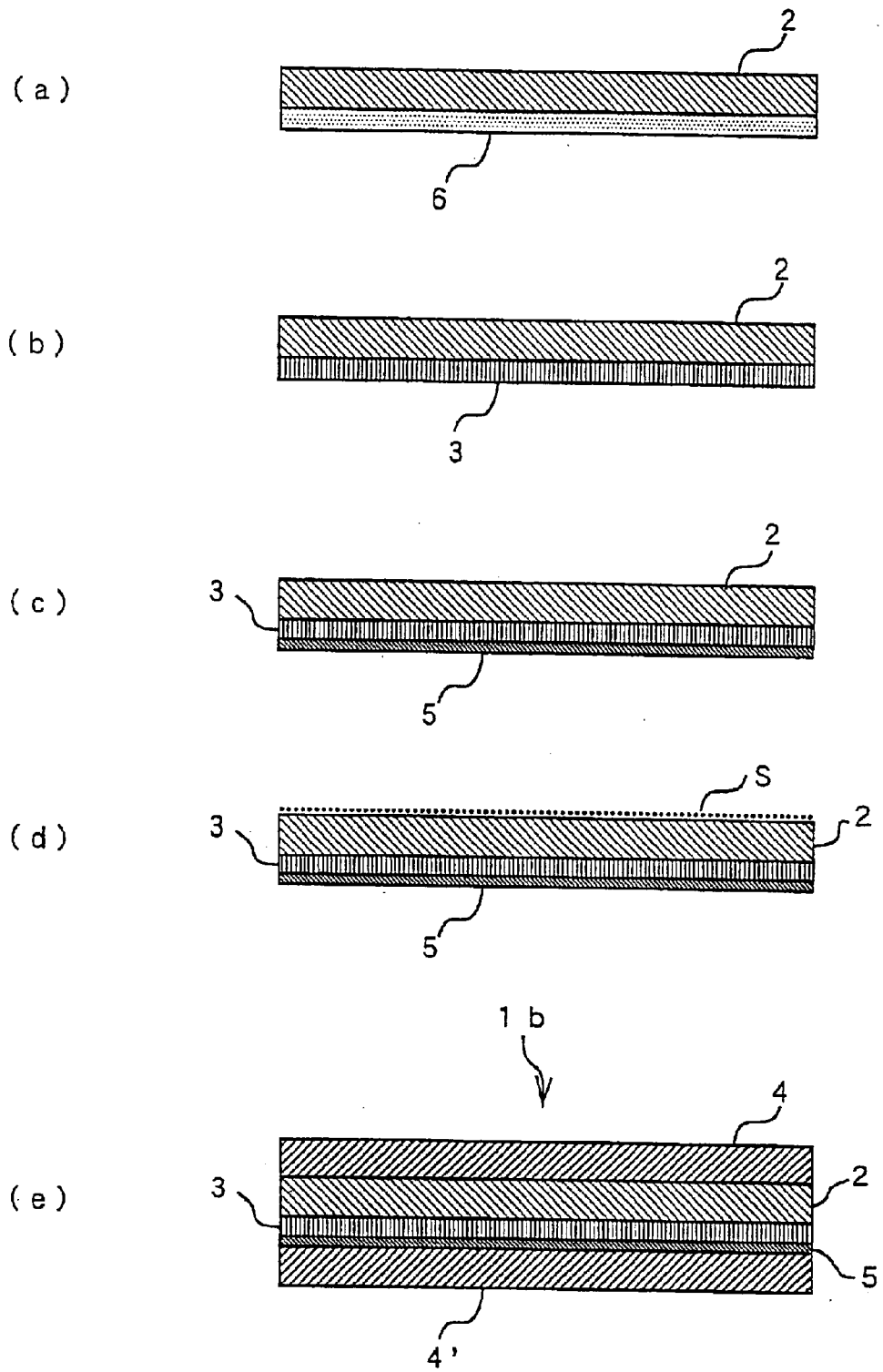
FIG. 7 is a schematic conceptual view representing a manufacturing flow of a laminate for forming a capacitor layer.

This manufacturing method is represented by a manufacturing flow in FIG. 7. That is, steps from anodizing an aluminum material 2 as shown in FIG. 7(*a*) to performing a modifying treatment as shown in FIG. 7(*b*) are the same as the method for manufacturing the first laminate 1*a* for forming the capacitor layer. A subsequent step for forming the binder metal layer 5 as shown in FIG. 7(*c*) is also the same as that already mentioned in the above manufacturing method. However, a method for manufacturing the first electrode copper layer 4 and the second electrode copper layer 4' in this case is different from that which has been already mentioned. That is, these first electrode copper layer 4 and second electrode copper layer 4' are manufactured at a final step.

Therefore, a thin film copper layer is formed on a surface of the binder metal layer 5 by means of the electroless copper plating. Preferably, a seed metal S such as a trace amount of zinc allowing for copper precipitation is precipitated on a surface of an outer layer of the aluminum material 2 as shown in FIG. 7(*d*), in terms of ensuring the adhesive property between the first copper layer 4 and the aluminum material 2. After the binder metal layer 5 and the seed metal layer S on the aluminum material 2 (the amount of deposit is as extremely small as 1 mg or less per square meter, so that an illustration of the seed metal layer S is omitted in the completed schematic sectional view of FIG. 7(*e*)) are formed, the copper layers may be precipitated on both sides by means of the electrolytic method. Adopting such a technique, it becomes possible to easily manufacture the laminate for forming the capacitor layer as shown in FIG. 7(*e*) which comprises the five-layered structure of the second electrode copper layer/the binder metal layer/the aluminum layer/the modified alumina barrier layer/the first electrode copper layer and uses the modified alumina layer as the dielectric layer.

Making use of the laminate for forming the capacitor layer described above, a capacitor circuitry can be easily formed by an etching process of a printed wiring board, and this laminate is suitable for use in the formation of an inner layer capacitor layer of a multi-layer printed wiring board. Thus, the multi-layer printed wiring board comprising the capacitor circuit which is formed by the use of the laminate for forming the capacitor layer according to the present invention is described in claims.

Further, when the second laminate for forming the capacitor layer is used, a method for forming an inner layer core material of a multi-layer printed wiring board as described below can be adopted. The term "an inner layer core material" as used herein means a printed wiring board used for being packaged and laminated within the multi-layer printed wiring board.

That is, the method is defined as "a method for manufacturing an inner layer core material of a multi-layer printed wiring board which uses the second laminate for forming the capacitor layer comprising the five-layered structure of the second electrode copper layer/the binder metal layer/the modified alumina barrier layer/the aluminum layer/the first electrode copper layer, characterized by (1) forming a capacitor circuit only on one side of the laminate by etching either of the first electrode copper layer or the second electrode copper layer and continuously etching the binder metal layer or the aluminum layer disposed under the first or second electrode copper layer in order to form a desired pattern, (2) putting the one side with the capacitor circuit formed thereon into a certain state such that an interlayer insulating layer component is laminated to the one side by overlaying the interlayer insulating layer component such as a prepreg on the one side and pressing them to be laminated, (3) forming a capacitor circuit on the other side of the laminate, to which an interlayer insulating layer component is not laminated, by etching either of the copper layers and further etching the binder metal layer or the aluminum layer disposed under the copper layer in order to form a desired pattern, (4) overlaying an interlayer insulating component such as a prepreg on the other side on which the capacitor circuit is formed and pressing them to be laminated to obtain a certain state such that the interlayer insulating layer components are laminated to both sides of the laminate, (5) making penetrating holes such as through holes or via holes by performing perforation, (6) carrying out an inactivation treatment of an aluminum portion which is exposed to a surface of an inner wall portion of the above described penetrating hole, and (7) coating the inner wall portion of the above described penetrating hole with a copper plating in order to ensure interlayer conduction between the first electrode copper layer and the second electrode copper layer."

The first characteristic of this manufacturing method is as follows. That is, the second laminate for forming the capacitor layer is used, and initially a capacitor circuit is formed by etching only one side of the laminate and then the interlayer insulating material is laminated thereto, and subsequently an opposing capacitor circuit is formed by etching the other side of the laminate and then an interlayer insulating material is further laminated thereto. Adopting such processing steps, it becomes possible to form a capacitor circuit without damaging the modified alumina barrier layer as the dielectric layer, even if the thickness of the second laminate for forming the capacitor layer is extremely diminished.

Therefore, the capacitor circuit is formed only on one side of the laminate by etching either of the first electrode copper layer or the second electrode copper layer and further etching the binder metal layer or the aluminum layer disposed under the copper layers in order to form a desired pattern. At this point, the binder metal layer is laid under the first electrode copper layer and the aluminum layer is laid under the second electrode copper layer. If the capacitor circuit is intended to be formed by etching, the aluminum layer under the second electrode copper layer can be easily removed with copper. On the other hand, in the case of the binder metal layer under the first electrode copper layer, similarly the binder metal layer can be removed easily by an etchant for copper when the binder metal layer is aluminum and chromium. However, when nickel is used as the binder metal layer, there is a tendency to become difficult to simultaneously etch off the binder metal layer and copper. Consequently, it is preferable that only copper is etched off, and subsequently, etching is repeatedly performed by using a nickel selective etchant which never dissolves copper. Because surface migration may be caused by a short failure if metal components remain between the circuits.

Then, after the formation of the capacitor circuit on the one side is completed, the one side is put into a certain state such that an interlayer insulating layer component is laminated to the one side by overlaying the interlayer insulating layer component such as a prepreg on the one side and pressing them to be laminated. The interlayer insulating component as used herein means a prepreg which is used for a so-called rigid substrate and a film material such as a polyimide film which is used for a flexible substrate for example, so that there is no need to particularly limit the materials used for the interlayer insulating component. Also, as for the conditions of overlaying and pressing the interlayer insulating layer component, there is no problem as long as the pressing conditions which have been determined in accordance with the properties of the interlayer insulating layer component are adopted. This can be said for the pressing described below.

Subsequently, a capacitor circuit is formed on the other side of the laminate to which an interlayer insulating layer component is not laminated by etching either of the copper layers and further etching the binder metal layer or the aluminum layer disposed under the copper layer in order to form a desired pattern. Then, after this formation, an interlayer insulating component such as a prepreg is overlaid on the other side on which the capacitor circuit is formed and pressing them to be laminated to obtain a certain state such that the interlayer insulating layer components are laminated to both sides of the laminate. Since these processing methods are the same as that already mentioned above, the description thereof will be omitted here.

Then, penetrating holes such as through holes or via holes are made by performing perforation, and subsequently, an inactivation treatment of an aluminum portion which is exposed to a surface of an inner wall portion of the above described penetrating hole is carried out before the copper plating is performed for ensuring the interlayer conduction. This inactivation treatment is a second characteristic. As a method used herein for the perforation, it is possible to adopt a processing method such as a mechanical pressing which uses a drill bit or a perforation which uses a laser, but there is no need to particularly limit the methods to be used. However, the aluminum portion exposed to the inner wall portion of the penetrating hole immediately after the perforation has an extremely thin oxide layer on a surface thereof, so that this aluminum portion does not have an excellent corrosion resistance, unlike aluminum in its normal condition. If plating for obtaining the interlayer conduction is performed immediately after the perforation by immersing the laminate in a strongly acidic or strongly alkaline copper plating solution, the aluminum portion is damaged. Thus, there is a necessity to grow the oxide film, which is on a surface of the aluminum portion exposed to the inner wall portion of the penetrating hole immediately after the perforation, until a favorable corrosion resistance is obtained, or alternatively, there is a necessity to form a protective film. This is referred to as "an inactivation treatment" in this specification.

Since this inactivation treatment is carried out for the aluminum portion exposed to the inner wall portion of the penetrating hole, it is preferable that the protective film is formed by means of a boehmite process or a so-called conversion treatment. In the former boehmite process, a boehmite ($Al_2O_3.3H_2O$) film is formed on a surface of the aluminum portion by boiling it in water or treating it within saturated vapor. The processing time required for this formation is 10 to 30 minutes during which a film having a thickness of 0.2 $\mu$m or less can be formed.

As the conversion treatment, it is preferable that a chromate filming treatment is adopted, in which a bath composition comprising a non-accelerating system is used and this treatment is carried out within this bath for about 10 seconds at a bath temperature ranging from a room temperature to 40° C. The reason of using this chromate filming treatment is as follows. That is, copper which exists as a metal other than aluminum coexists with the aluminum when the conversion treatment is carried out, so that a bath including a trace amount of elements which do not adversely affect the subsequent formation of the interlayer conduction plating even if the plating is deposited on a copper surface and which do not significantly affect an electric resistance or the like should be selected. Therefore, it may be inappropriate to use a non-chromate filming treatment in which a zirconium or titanium-based film having a possibility of significantly increasing the electric resistance is formed, and to use a phosphate-chromate filming treatment and a zinc phosphate filming treatment for example in which phosphorus having a possibility of significantly affecting the electric resistance is included. The film which is formed by the chromate filming treatment becomes a complex of $Cr(OH)_2.HCrO_4$, $Al(OH)_3.2H_2O$.

Then, the interlayer conduction is ensured by forming a copper plating layer on the inner wall portion of the penetrating holes such as a through hole and a via hole. The copper plating at this time is formed by performing electroless copper plating and subsequently performing electrolytic copper plating. The conditions of the electroless plating and the electrolytic copper plating at this time are not particularly limited. However, the plating layer may be formed only on the inner wall portion of the above described penetrating hole, or the plating layer may be formed such that the copper plating layer is also provided on a surface of the interlayer insulating component disposed at each side of the laminate in addition to the inner wall portion of the penetrating hole. In the latter case, the laminate becomes a so-called four-layer copper clad laminate. Therefore, as a copper layer for forming a copper circuit, it becomes possible to use the copper plating layer on the surface of the interlayer insulating component as it is.

BEST MODE FOR CARRYING OUT THE INVENTION

As an embodiment of the present invention, a laminate for forming a capacitor layer according to the present invention was manufactured and capacitance of a capacitor which is manufactured by using the laminate for forming the capacitor layer was measured, as described below.

FIRST EXAMPLE

Manufacture of a first laminate 1a for forming a capacitor layer will be described with reference to FIG. 5. In this example, a 30 cm square size of aluminum foil 2 having a thickness of 100 $\mu$m and a purity of 99.99% was used as a starting raw material. And, in an alumina barrier-layer-forming step shown in FIG. 5(a), this aluminum foil 2 was immersed in an aqueous solution of ammonium borate whose concentration is 80 g/l, then an anodic polarization treatment was carried out under a direct current (the current within a range from 5 to 20 A/dm$^2$) at a formation voltage within a range from 30V to 700V to form an alumina barrier layer 6. The alumina barrier layer 6 having a thickness from 40 nm to 980 nm (as converted values provided that the alumina barrier layer 6 was formed at a rate of 1.4 nm per formation voltage) was formed only on one side of the aluminum foil 2 and the other side of the aluminum foil 2 was sealed such that the alumina barrier layer 6 was not formed on thereon, then an alumina barrier layer-applied aluminum material A was manufactured. At this time, a platinum electrode was used as a cathode electrode.

The alumina barrier layer-applied aluminum material A was sufficiently washed by pure water and then a boiling-and-modifying step was carried out as described below. In the boiling-and-modifying step shown in FIG. 5(b), the above described alumina barrier layer-applied aluminum material A was subjected to a boiling treatment for 5 minutes within boiled pure water to obtain a modified alumina barrier layer 3.

After the completion of the boiling-and-modifying step, in an electrode-copper-layer-forming step shown in FIG. 5(c), a surface of the modified alumina barrier layer 3 of the alumina barrier layer-applied aluminum material A was catalyzed by palladium to form a thin film copper layer by means of the electroless copper plating method. As an electroless copper plating as used herein, a bath comprising 30 g/dm$^3$ of copper sulfate, 100 g/dm$^3$ of Rochelle salt, 30 cm/dm³ of formaldehyde (37%), 30 g/dm³ of sodium carbonate, and 30 g/dm³ of sodium hydroxide was used, and a temperature of the bath was set at 24° C. In this case, a thin film copper layer having a thickness of 2 μm was deposited. The thickness of 2 μm was a converted value provided that the thin film copper layer was uniformly deposited on a flat surface.

After the completion of the formation of the thin film copper layer, the thin film copper layer was continuously grown by means of the electrolytic method in order to form an electrode copper layer 4. The growth of the thin film copper layer by means of the electrolytic method was performed as follows. That is, the thin film copper layer and a cathode terminal were connected to each other and a stainless plate was placed as an anode electrode, and further, this aluminum material A was immersed in a copper sulfate bath having a temperature of 45° C. and comprising 150 g/l of sulfuric acid and 65 g/l of copper in order to perform electrolysis for 10 seconds under the smooth plating condition that a current density was 15 A/dm³, and consequently, copper component corresponding to a thickness of about 3 μm was uniformly and smoothly electrodeposited on the above described thin film copper layer. Therefore, the electrode copper layer 4 itself which was a combination of the thin film copper layer and the electrolytic copper layer was made such that the thickness of the electrode copper layer 4 became about 5 μm. Consequently, a 25 cm square of laminate 1a for forming the capacitor layer shown in FIG. 1, comprising three-layered structure of the aluminum layer 2 having a thickness of 100 μm, the modified alumina barrier layer 3 having a thickness from 84 nm to 700 nm, and the electrode copper layer 4 having a thickness of 5 μm and using the modified alumina barrier layer 3 as the dielectric layer, was obtained.

In this example, a rust proofing was further performed by using zinc as an anti rust element for the purpose of preventing surface oxidation of the electrode copper layer 4. In the drawing, an illustration of an anti rust layer is omitted. In this step, the electrode copper layer 4 of the laminate 1a for forming the capacitor layer was subjected to an cathodic polarization treatment and a stainless plate was placed as a counter electrode, and further, a zinc sulfate bath comprising 70 g/l of sulfuric acid and 20 g/l of zinc and was used to treat the electrode copper layer 4 under the condition that a solution temperature was 40° C., a current density was 15 A/dm³, and an electrolysis time was 5 seconds. In this case, a zinc plate was used as an anode electrode and allowed to dissolve during the electrolysis in accordance with an amount of electricity in order to maintain a concentration of zinc in the solution constant. After the completion of the rust proofing, the laminate 1a for forming the capacitor layer was ultimately dried within an oven which was heated to an atmospheric temperature of 110° C. by an electric heater over 40 seconds.

Then, within an regional area of the 25 cm square of the laminate 1a for forming the capacitor layer thus obtained, a measurement pattern was formed in accordance with a paragraph 2.5.5.9 of IPC-TM-650 which is a test manual of the IPC Standard, and further, capacitances were measured at 1 MHz by the used of an LCR maker 4261A manufactured by Yokogawa-Hewlett-Packard Company.

TABLE 1

| Formation Voltage (V) | Capacitance: $Cp(nF/cm^2)$ | | | |
|---|---|---|---|---|
| | Cp(min) Minimum Value | Cp(max) Maximum Value | Cp(ave) Average Value | $\Delta Cp = \{Cp(max)\} - \{Cp(min)\}$ |
| 30 | 85 | 180 | 105 | 95 |
| 60 | 75 | 121 | 98 | 46 |
| 80 | 73 | 103 | 94 | 30 |
| 100 | 60 | 88 | 82 | 28 |
| 200 | 23 | 48 | 45 | 25 |
| 300 | 12 | 33 | 26 | 21 |
| 500 | 8 | 20 | 13 | 12 |
| 700 | 5 | 11 | 8 | 6 |

Table 1 shows a result of measuring capacitances at 20 points on each of the laminates 1a for forming the capacitance layers which were manufactured at different formation voltages, wherein Cp (min) is a minimum value of the measured capacitances, Cp (max) is a maximum value of the measured capacitances, Cp (ave) is an average value of the measured capacitances, and $\Delta Cp=\{Cp (max)\}-\{Cp (min)\}$. Among these values, $\Delta Cp$ is used as an indication of variations in the measurement values, so that it can be seen that the variations in the measurement values becomes smaller with the $\Delta Cp$ value.

As apparent from the result shown in Table 1, it is indicated that a capacitor having a capacitance of 5 $nF/cm^2$ at the lowest and a capacitance of up to 180 $nF/cm^2$ can be obtained at a formation voltage within a range from 30V to 700V. Considering that the conventional capacitor has a capacitance of 2 $nF/cm^2$ or less, it can be seen that the capacitor of the present invention has an extremely high capacitance. In addition, it is indicated that the capacitance as a capacitor increases based on theory, since a thickness of the alumina barrier layer 6 is reduced when the formation voltage also decreases. However, it can be considered that the thickness stability of the modified alumina barrier layer 3 may also be compromised by the reduction in the thickness of the alumina barrier layer 6. This can be inferred from this table indicating that the $\Delta Cp$ value representing the variations of the measured values becomes smaller as the formation voltage becomes higher and the thickness of the alumina barrier layer 6 also increases.

SECOND EXAMPLE

In this example, a second laminate 1b for forming a capacitor layer shown in FIG. 4 as described above was manufactured in accordance with a manufacturing flow shown in FIG. 6. Firstly in this case, in a first-electrode-copper-layer-forming step as shown in FIG. 6(a), a thin film copper layer having a thickness of 2 μm or less was formed on one side of an aluminum material 2 by means of an electroless plating method or a vapor phase deposition method, and copper was further precipitated on a surface of the above described thin film copper layer by means of an electrolytic copper plating method in order to form a first electrode copper layer 4 (this is the same reference numeral as that used for "the electrode copper layer " in the first example). In this example, a 30 cm square size of aluminum foil 2 having a thickness of 100 μm and a purity of 99.99% was used as a starting raw material. The thin film copper layer was formed on the one side of the aluminum material 2 by means of the electroless copper plating method and copper was further precipitated on the thin film copper layer by means of the electrolytic copper plating method in order to form the first electrode copper layer 4 as in the case of the first example. In this manner, as for the manufacturing conditions, a method which is the same as that already mentioned above is adopted, so that the detailed description will be omitted to avoid repeatedly explaining thereof.

Then, in an alumina barrier-layer-forming step as shown in FIG. 6(*b*), the aluminum foil 2 on which the above described first electrode copper layer 4 was formed was subjected to an anodic polarization treatment within an electrolyte, and an alumina barrier layer 6 having a thickness of 1 μm or less was formed on the other side on which the first electrode copper layer 4 is not formed. Since the method for forming the alumina barrier layer 6 in this step is also the same as that described in the first example, the detailed description will be omitted to avoid repeatedly explaining thereof. However, in this example, the anodic polarization treatment was carried out at a formation voltage range of 100V to form the alumina barrier layer 6. Consequently, the alumina barrier layer 6 having a thickness of 140 nm was formed only on the other side.

Subsequently, in an boiling-and-modifying step as shown in FIG. 6(*c*), the aluminum foil 2 having the above described first electrode copper layer 4 and the alumina barrier layer 6 was boiled in pure water and the alumina barrier layer 6 was treated to be modified in order to modify the alumina barrier layer 6, then a modified alumina barrier layer 3 having a thickness of about 100 nm was obtained. Since this modifying treatment is also the same as that described in the above first example, the detailed description will be omitted to avoid repeatedly explaining thereof.

Next, in a binder-metal-layer-forming step as shown in FIG. 6(*d*), aluminum was deposited on a surface of the modified aluminum barrier layer 3 of the aluminum material 2 having the above described first electrode copper layer 4 and the modified alumina barrier layer 3 by means of a sputtering deposition method to form a binder metal layer 5. The sputtering deposition in this case was performed as follows. That is, an inside of a chamber of a sputtering apparatus in which an Al target was placed was evacuated to a vacuum of about $1.33 \times 10^{-3}$ Pa ($1.33 \times 10^{-5}$ torr), and an aluminum layer having a thickness of about 1 μm was formed on a surface of the modified alumina barrier layer 3 within the atmosphere by means of an ion plating method.

And finally, in a second-electrode-copper-layer-forming step as shown in FIG. 6(*e*), a copper layer which became a second electrode copper layer 4' was formed on a surface of the above described binder metal layer 5. Since the binder metal layer 5 was an aluminum layer, the second electrode copper layer 4' was formed such that a trace amount of zinc was electrodeposited by using the solution used for the rust proofing in the first example and then the copper layer was formed by means of an electrolytic method. The electrolysis condition or the like was the same as that used for increasing the thickness of the first electrode copper layer 4. Therefore, the detailed description will be omitted to avoid repeatedly explaining thereof. Subsequently, rust-proofing was performed on surfaces of the copper layers respectively disposed at both sides of the laminate. Consequently, the laminate 1*b* for forming the capacitor layer, which was characterized by comprising a five-layered structure of the second electrode copper layer 4'/the binder metal layer 5/the modified alumina barrier layer 3/the aluminum layer 2/the first electrode copper layer 4 and by using the modified alumina barrier layer 3 as a dielectric layer, was obtained.

Then, capacitances were measured by the same method as described in the first example. That is, the capacitances were measured at 20 points on each of the laminates 1*b* for forming the capacitance layers, and the minimum value Cp (min)=55.8 nF/cm², the maximum value Cp (max)=74.4 nF/cm², the average value Cp (ave)=63.5 nF/cm², and ΔCp=18.6 nF/cm². The value ΔCp is small, so that it is indicated that the measured values are extremely stable.

THIRD EXAMPLE

In this example, a result of manufacturing a multi-layered copper clad laminate MLB by the use of the laminate 1*b* for forming the capacitor layer which was manufactured in the second example described above will be described.

Figure 8:
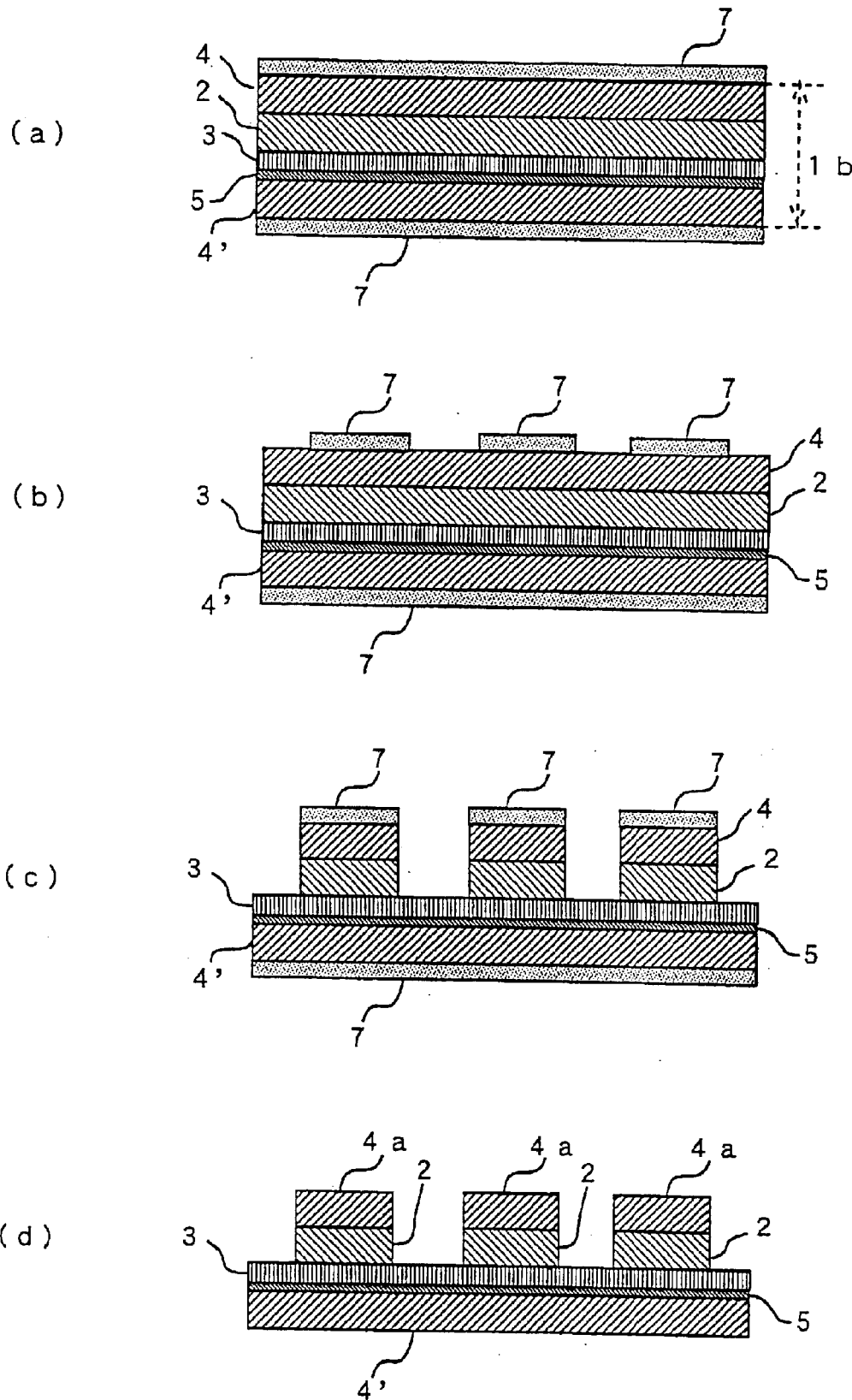

Thus, a dry film 7 as an etching resist was firstly laminated to each side of the laminate 1*b* for forming the capacitor layer manufactured in the second example, as shown in FIG. 8(*a*). Then, a dry film disposed on the first electrode copper layer 4 was exposed to light and developed to form a capacitor circuit pattern as shown in FIG. 8(*b*). At this time, a dry film 7 disposed on the other side where the first electrode copper layer 4' was formed was only cured all over its surface. After the completion of the exposure and development, circuit etching was performed by using a ferric chloride copper etchant to simultaneously remove the first electrode copper layer 4 and the aluminum layer 2 in order to form a capacitor circuit 4*a*, as shown in FIG. 8(*c*). At this time, the second electrode copper layer 4' remained as it was without being etched off, because the dry film 7 was disposed on a surface of the second electrode copper layer 4' on the other side.

Figure 9:
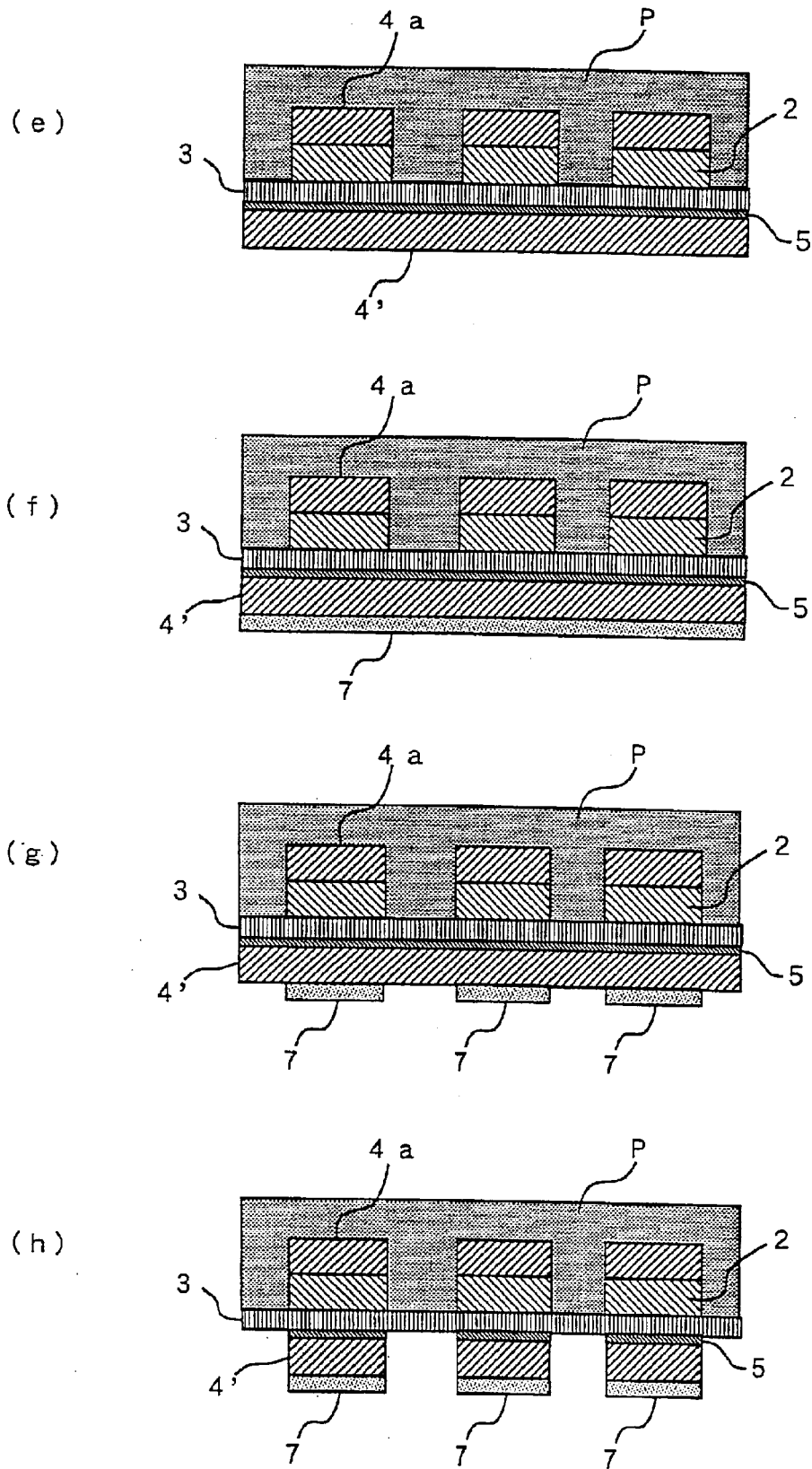

After the completion of the circuit etching on the one side, the dry films 7 remaining on both sides were stripped, and the obtained laminate was washed with water and dried as shown in FIG. 8(*d*). Then, a prepreg P was laminated to a surface on which the capacitor circuit 4*a* was formed as shown in FIG. 9(*e*). That is, a sheet of an FR-4 prepreg P having a thickness of 100 μm was overlaid on a surface on which the capacitor circuit 4*a* was formed, and then heated for 60 minutes at 180° C., pressed and laminated to the surface. Consequently, the prepreg P was laminated to the one side.

Subsequently, a dry film 7 was laminated again to a surface of the second electrode copper layer 4' disposed on the other side to which an interlayer insulating layer component was not laminated, as shown in FIG. 9(*f*). The dry film 7 was exposed to light and developed to form a capacitor circuit pattern on a surface of the film, as shown in FIG. 9(*g*). Then, as shown in FIG. 9(*h*), the second electrode copper layer 4' and the binder metal layer (aluminum layer) 5 disposed under the second electrode copper layer 4' were simultaneously etched off to form a capacitor circuit 4'. Since the etching method is the same as that already mentioned above, the detailed description will be omitted. In this step, the prepreg has already been laminated to the one side, so that there is no need to seal the one side particularly.

Figure 10:
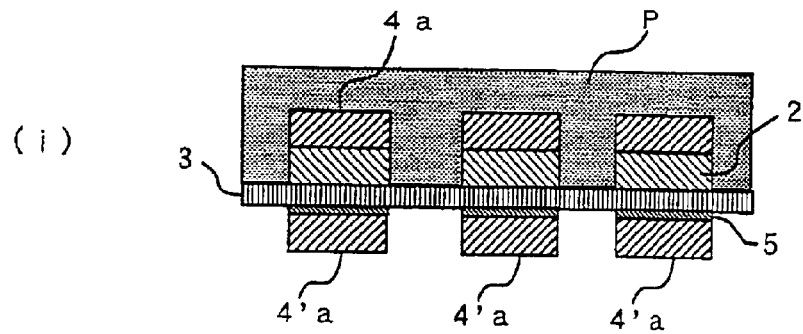
FIG. 10 is a schematic conceptual view representing a manufacturing flow of an internal layer core material which uses a laminate for forming a capacitor layer.
Figure 10:
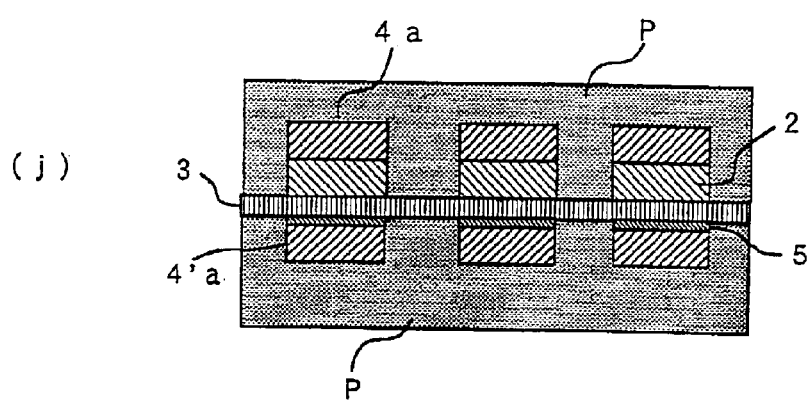
Figure 10:
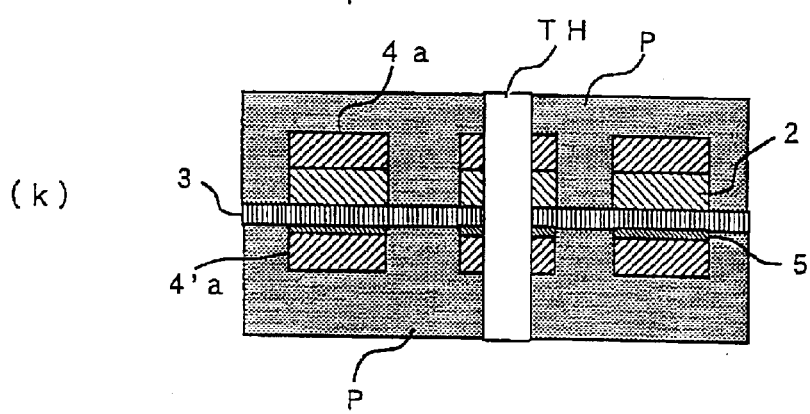
Figure 10:
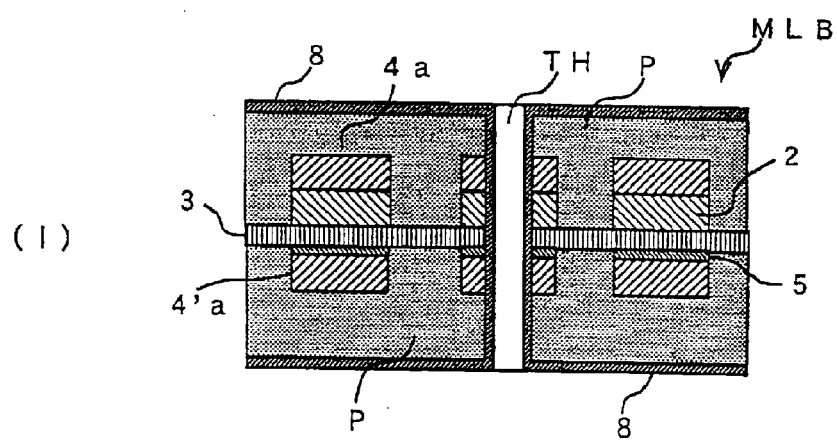

And subsequently, after the dry film 7 was stripped as shown in FIG. 10(*i*), an FR-4 prepreg P having a thickness of 100 μm was laminated to a surface on which the capacitor circuit 4'*a* was formed on the other side and the prepreg was pressed to be laminated to the surface. In this manner, the interlayer insulating layer components were laminated to both sides as shown in FIG. 9(*h*). The pressing condition in this case was the same as that already mentioned above.

Then, in order to make a penetrating hole, a through hole TH having a diameter of 250 μm was made by perforation in which a drill bit was used, as shown in FIG. 10(*k*). In this step, before copper plating for ensuring the inter layer conduction, an inactivation treatment of an aluminum portion exposed to the inner wall portion of the above described penetrating hole was carried out. A boehmite process was adopted as this inactivation treatment, and consequently, a boehmite ($Al_2O_3.3H_2O$) film was formed by boiling the laminate for 10 minutes in pure water.

After the completion of the inactivation treatment, the inner wall portion of the through hole penetrating hole was coated with a copper plating layer 8. The copper plating 8 at this time was formed such that an electroless copper layer having a thickness of about 2 μm was formed by means of the electroless copper plating solution and conditions which were the same as in the case of the first example and then electrolytic copper plating was performed. The copper electrolyte used for this electrolytic copper plating was a copper sulfate solution containing 150 g/l of sulfuric acid and 65 g/l of copper and having a solution temperature of 45° C., and an electrolytic copper plating layer having a thickness of about 8 μm was precipitated under the smooth plating condition that a current density was 10 A/dm². Therefore, an overall thickness of the copper layer 8 was about 10 μm.

This copper plating layer 8 was also precipitated to be formed on the prepreg P disposed on each side, and consequently, a so-called four-layer multi-layered copper clad laminate MLB was obtained. In this case, the copper plating layer 8 on a surface of the interlayer insulating component could be used as a copper layer forming a copper circuit, without being processed.

Industrial Applicability

A laminate for forming a capacitor layer according to the present invention comprises a three-layered structure of an aluminum layer/an alumina (aluminum oxide) layer/a copper layer or a five-layered structure of a second electrode copper layer/a binder metal layer/a modified alumina barrier layer/an aluminum layer/a first electrode copper layer, and the alumina layer as a dielectric layer can be formed as a thin film layer having an unprecedented small thickness and uniformity by directly forming this alumina layer on the aluminum layer, therefore, it becomes possible to manufacture a capacitor having an unprecedentedly and extremely high capacitance by using this layer as a dielectric layer of the capacitor. In addition, a thickness of the laminate for forming the capacitor layer according to the present invention can be easily controlled because a technique for cladding or laminating materials is not adopted, and an overall thickness of a multi-layer printed wiring board can be effectively made thinner by using the laminate as an inner layer of the multi-layer printed wiring board.

What is claimed is:

1. A laminate for forming a capacitor layer comprising a three-layered structure of an aluminum layer/a modified alumina barrier layer/an electrode copper layer, wherein the modified alumina barrier layer is obtained through subjecting one side of an aluminum material which comprises an aluminum plate or aluminum foil to an anodic treatment to form an alumina barrier layer which is a uniform oxide layer and then subjecting the aluminum material on which the alumina barrier layer is formed to a boiling treatment in water, the modified alumina barrier layer being used as a dielectric layer.

2. A method for manufacturing the laminate for forming the capacitor layer, said laminate being defined in claim 1, wherein the method comprises (1) an alumina barrier-layer-forming step in which the aluminum plate or the aluminum foil undergoes anodic polarization within an electrolyte and then the alumina barrier layer which is the uniform oxide layer having a thickness of 1 μm or less is formed on a surface of the aluminum material, (2) a boiling-and-modifying step for boiling the alumina barrier layer-applied aluminum material in water and subjecting the alumina barrier layer to a modifying treatment to obtain the modified alumina barrier layer, and (3) an electrode-copper-layer-forming step for forming the copper layer having a thickness of 2 μm or less on a surface of the modified alumina barrier layer by means of an electroless plating method or a vapor phase deposition method and then further precipitating copper on a surface of thus formed thin film copper layer by means of an electrolytic copper plating method.

3. A multi-layer printed wiring board comprising a capacitor circuit which is formed with the use of the laminate for forming the capacitor layer, said laminate being defined in claim 1.

4. A laminate for forming a capacitor layer comprising a five-layered structure of a second electrode copper layer/a binder metal layer/a modified alumina barrier layer/an aluminum material layer/a first electrode copper layer, wherein the binder metal layer is made of any of aluminum, nickel, or chromium, or an alloy thereof, and that the modified alumina barrier layer is obtained through subjecting one side of the aluminum material to an anodic treatment to form an alumina barrier layer which is a uniform oxide layer and then subjecting the aluminum material on which the alumina barrier layer is formed to a boiling treatment in water, the modified alumina barrier layer being used as a dielectric layer.

5. A method for manufacturing the laminate for forming the capacitor layer, said laminate being defined in claim 4, wherein the method comprises (1) a first-electrode-copper-layer-forming step in which a thin film copper layer having a thickness of 2 μm or less is formed on one side of the aluminum material by means of an electroless plating method or a vapor phase deposition method and then copper is further precipitated on a surface of thus formed thin film copper layer by means of an electrolytic copper plating method to form the first electrode copper layer, (2) a barrier-layer-forming step in which an aluminum material on which said first electrode copper layer is formed undergoes anodic polarization in an electrolyte and the alumina barrier layer which is the uniform oxide layer having a thickness of 1 μm or less is formed on the other side of the aluminum plate on which the first electrode copper layer is not formed, (3) a boiling-and-modifying step for boiling the alumina barrier layer-applied aluminum material in water to convert the alumina barrier layer into the modified alumina barrier layer, (4) a binder-metal-layer-forming step for providing the binder metal layer made of any of aluminum, nickel, or chromium on a surface of the modified alumina barrier layer by means of the vapor phase deposition method, and (5) a second-electrode-copper-layer-forming step for forming a copper layer which becomes the second electrode copper layer on a surface of said binder metal layer.

6. A method for manufacturing the laminate for forming the capacitor layer, said laminate being defined in claim 4, wherein the method comprises (1) a first-electrode-copper-layer-forming step in which the first electrode copper layer is formed on a surface of aluminum material by cladding the aluminum material with copper foil, (2) a barrier-layer-forming step in which an aluminum material on which the first electrode copper layer is formed undergoes anodic polarization within an electrolyte and the alumina barrier layer which is the uniform oxide layer having a thickness of 1 μm or less is formed on the other side of the aluminum plate on which the first electrode copper layer is not formed, (3) a boiling-and-modifying step for boiling the alumina barrier layer-applied aluminum material in water to convert the alumina barrier layer into the modified alumina barrier layer, (4) a binder-metal-layer-forming step for providing the binder metal layer made of any of aluminum, nickel, or chromium on a surface of the modified alumina barrier layer by means of a vapor phase deposition method, and (5) a second-electrode-copper-layer-forming step for forming a copper layer which becomes the second electrode copper layer on a surface of said binder metal layer.

7. A method for manufacturing an inner layer core material of a multi-layer printed wiring board which uses the laminate for forming the capacitor layer comprising the five-layered structure of the second electrode copper layer/ the binder metal layer/the modified alumina barrier layer/the aluminum layer/the first electrode copper layer, said laminate being defined in claim 4, wherein the method comprises (1) an alumina-barrier-layer-forming step in which the aluminum material undergoes anodic polarization within an electrolyte and the alumina barrier layer which is the uniform oxide layer having a thickness of 1 μm or less is formed on one side of the aluminum material, (2) a boiling-and-modifying step for boiling the alumina barrier layer-applied aluminum material in water and subjecting the alumina barrier layer to a modifying treatment to obtain the modified alumina barrier layer, (3) a binder-metal-layer-forming step for providing the binder metal layer made of any of aluminum, nickel, or chromium on a surface of the modified alumina barrier layer by means of a vapor phase deposition method, and (4) an electrode-copper-layer-forming step in which the first electrode copper layer is formed on a surface of an outer layer of the aluminum material and a copper layer which becomes the second electrode copper layer is formed on a surface of said binder metal layer.

8. A method for manufacturing an inner layer core material of a multi-layer printed wiring board which uses the laminate for forming the capacitor layer comprising the five-layered structure of the second electrode copper layer/ the binder metal layer/the modified alumina barrier layer/the aluminum layer/the first electrode copper layer, said laminate being defined in claim 4, wherein said method comprising the steps of: (1) forming a capacitor circuit only on one side of the laminate by etching either of the first electrode copper layer or the second electrode copper layer and continuously etching the binder metal layer or the aluminum layer disposed under the first or second electrode copper layer in order to form a desired pattern, (2) putting the one side with the capacitor circuit formed thereon into a certain state such that an interlayer insulating layer component is laminated to the one side by overlaying the interlayer insulating layer component such as a prepreg on the one side and pressing them to be laminated, (3) forming a capacitor circuit on the other side of the laminate, to which an interlayer insulating layer component is not laminated, through etching either of the copper layers and continuously etching the binder metal layer or the aluminum layer disposed under the copper layer in order to form a desired pattern, (4) overlaying an interlayer insulating component such as a prepreg on the other side on which the capacitor circuit is formed and pressing them to be laminated to obtain a certain state such that the interlayer insulating layer components are laminated to both sides of the laminate, (5) making penetrating holes such as through holes or via holes through performing perforation, (6) carrying out an inactivation treatment of an aluminum portion which is exposed to a surface of an inner wall portion of the penetrating hole, and (7) coating the inner wall portion of the penetrating hole with a copper plating in order to ensure interlayer conduction between the first electrode copper layer and the second electrode copper layer.

9. A multi-layer printed wiring board comprising a capacitor circuit which is formed with the use of the laminate for forming the capacitor layer, said laminate being defined in claim 4.

* * * * *